United States Patent [19]

Havemann et al.

[11] Patent Number: 4,619,036
[45] Date of Patent: Oct. 28, 1986

[54] SELF-ALIGNED LOW-TEMPERATURE EMITTER DRIVE-IN

[75] Inventors: Robert H. Havemann, Garland; Samuel C. Baber, Richardson, both of Tex.

[73] Assignee: Texas Instruments Incorporated, Dallas, Tex.

[21] Appl. No.: 656,070

[22] Filed: Sep. 28, 1984

[51] Int. Cl.⁴ .................. H01L 21/265; H01L 21/322
[52] U.S. Cl. ................... 29/577 C; 29/576 B; 29/576 T; 148/1.5; 148/187; 148/DIG. 10; 357/34; 357/91; 427/53.1
[58] Field of Search ............ 29/577 C, 576 B, 576 T; 148/1.5, 187; 357/91, 34; 427/53.1

[56] References Cited

U.S. PATENT DOCUMENTS

| | | | |
|---|---|---|---|
| 4,338,139 | 7/1982 | Shinada | 148/1.5 |
| 4,377,031 | 3/1983 | Goto et al. | 29/576 B |
| 4,377,421 | 3/1983 | Wada et al. | 148/1.5 |
| 4,377,902 | 3/1983 | Shinada et al. | 29/576 B |

OTHER PUBLICATIONS

Joshi et al., IBM—TDB, 13, (1970), 928.
Anantha et al., IBM—TDB, 22, (1979), 575.
Hendel et al., Jour. Vac. Sci. Technol., 18, (1981), 818.
Tsunoda, Jap. Jour. Appl. Phys., 21, (1982), L-106.

*Primary Examiner*—Upendra Roy
*Attorney, Agent, or Firm*—Robert Groover, III; James T. Comfort; Melvin Sharp

[57] ABSTRACT

After the extrinsic base region of a bipolar transistor has been formed, and the emitter contact has been patterned and cut, the emitter dopant is deposited or spun on, and the emitter dopant is then driven in using a short pulse of radiant energy. The necessity for high-temperature annealing of the emitter doping is thereby avoided, and the base doping profile is not disturbed by high-temperature annealing steps.

8 Claims, 7 Drawing Figures

SELF-ALIGNED LOW-TEMPERATURE EMITTER DRIVE-IN

BACKGROUND AND SUMMARY OF THE INVENTION

The present invention relates to formation of bipolar transistors.

The present invention solves two problems associated with the fabrication of bipolar transistors. First is the difficulty in obtaining the shallow, highly-doped emitters which are required for good injection efficiency and narrow depletion widths in scaled bipolar devices. Second is the high temperature drive required for emitter junction formation which limits process flexibility, since any dopants already in the device are subject to diffusion.

In particular, the P+ extrinsic base (i.e. the heavily doped p+ region which surrounds the more lightly doped "intrinsic base" region which is actually interposed between the emitter and collector) will diffuse rapidly during a high temperature (1000° C.) anneal, which would alter the base/emitter and base/collector junction locations and limit the scalability of the device. For this reason, it has been necessary, in all prior art attempts to make scaled bipolar devices, to make the emitter before the extrinsic base region. This constraint has greatly impeded attempts to develop advanced processing schemes. In particular, such a process sequence is not very amenable to self-aligned emitter-base schemes, which are also necessary to improve design registration tolerance in scaled devices. Many schemes have been aimed at circumventing this difficulty, but, if the emitter could be formed after the extrinsic base without disturbing the base doping profiles, then self-aligned emitter-base structures would be inherently easier to fabricate.

The standard approach to achieving shallower emitter junctions is to use low energy, high-dose arsenic implants. However, the implant must be treated at high temperatures (1000° C.) to fully activate the dopant and anneal implant damage. As doses become higher with scaling needs, implant damage will become excessive.

Another newer technique involves the use of polysilicon as a diffusion source. The polysilicon is in intimate contact with the epitaxial growth surface and the dopant is implanted into, and driven through, the polysilicon to form the emitter junction in the single crystal epitaxial silicon surface. Although shallow emitter junctions can be formed in this manner, a high temperature drive still appears to be necessary.

Thus, it is an object of the present invention to provide fabrication of bipolar devices without high-temperature drive-in of the emitter doping.

It is a further object of the present invention to provide a method for fabricating bipolar transistors without disturbance of the base doping profile during emitter drive-in.

It is a further object of the present invention to provide a method for fabricating bipolar transistors without incurring heavy implant damage at the surface of the emitter.

Another difficulty in bipolar transistor fabrication is the n+ to p+ spacing required between the emitter contact doping and the extrinsic base doping. This spacing must be preserved, or the base-emitter breakdown voltage will collapse. However, the need for this spacing makes it difficult to use emitter lateral widths as small as would otherwise be possible.

It is a further object of the present invention to provide a method for fabricating bipolar transistors in which the emitter doping is self-aligned to the emitter contact pattern.

It is a further object of the present invention to provide a method for fabricating bipolar transistors in which the emitter doping does not require an excessively heavy dose.

Although the foregoing objects have been primarily described in reference to emitter formation in a bipolar transistor having a substrate collector and a surface emitter, all of the foregoing objects and all of the following disclosure is equally applied to inverted bipolar structures in which the collector is at the surface and the emitter is closer to the substrate, in which case the present invention is useful for collector doping.

The present invention achieves the foregoing objects, as well as other advantages, by a process wherein, after the extrinsic base region of a bipolar transistor has been formed, and the emitter contact has been patterned and cut, the emitter dopant is deposited or spun on, and the emitter dopant is then driven in using a short pulse of radiant energy. The necessity for high-temperature annealing of the emitter doping is thereby avoided, and the base doping profile is not disturbed by high-temperature annealing steps.

This provides at least three key advantages: first, the base doping profile is not significantly disturbed by emitter drive-in. Second, in the preferred embodiment, the base, emitter, and emitter contact are all three self-aligned. Third, the emitter contact etch occurs before the emitter contact doping is in place, so there is no uncertainty about how much dopant may have been removed from the emitter contact area by the contact etch, and high conductivity is preserved.

According to the present invention there is provided:

1. A process for fabricating integrated circuits comprising bipolar transistors, comprising the steps of:

providing a substrate having, at at least predetermined device locations, first conductivity type collector/emitter regions, second conductivity type intrinsic base regions above said collector/emitter regions, and first conductivity type surface regions above said intrinsic base regions, all formed in crystalline semiconductor material having a vertically continuous lattice structure through said collector/emitter, intrinsic base, and surface regions;

partially covering said surface region with a patterned protective layer, said patterned protective layer exposing portions of said surface layer;

depositing a first-conductivity-type dopant source over said patterned protective layer and said exposed portions of said surface layer, and applying transient radiant heating to said dopant source, whereby heavily-doped first-conductivity-type emitter/collector regions are formed within portions of said surface layer.

BRIEF DESCRIPTION OF THE DRAWINGS

The present invention will be discussed with reference to the accompanying drawings wherein.

DESCRIPTION OF THE PREFERRED EMBODIMENTS

Figure 1:
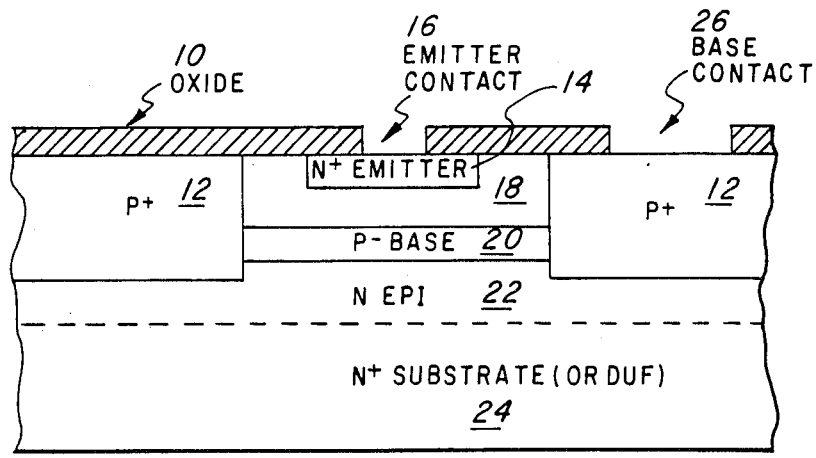
FIG. 1 shows a prior art bipolar structure.

This invention proposes using a laser-driven dopant to form the N+ emitter in conjunction with a self-aligned bipolar transistor structure. Consider the fabrication of an inverted NPN transistor as used in integrated injection logic (I2L). The normal structure is shown in FIG. 1. The emitter 14 (or collector 14 in the inverted structure) is normally formed first, followed by a non-self-aligned base 12, 20 (intrinsic 20 and extrinsic 12). Contact holes 16, 26 are then cut to the N+ and P+ regions 14, 12 while the N+ substrate (or buried layer (DUF)) 24 serves to form the remaining contact.

Figure 2:
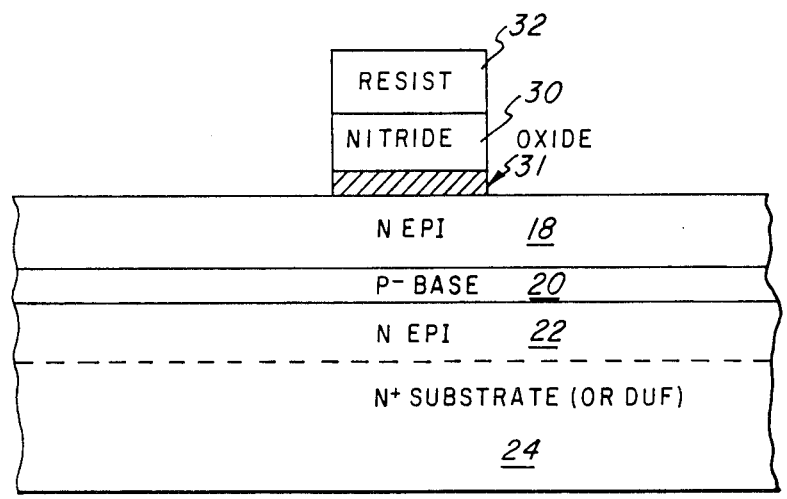
FIGS. 2–6 show successive steps in fabrication of the active device structure of a first embodiment of the invention.

In an example of a self-aligned process according to the present invention, intrinsic base 20 is first formed in the usual manner (pattern and implant). Then a thick nitride layer 30 is deposited over thin oxide 31 and patterned (using photoresist 32) with the emitter pattern as shown in FIG. 2.

Figure 3:
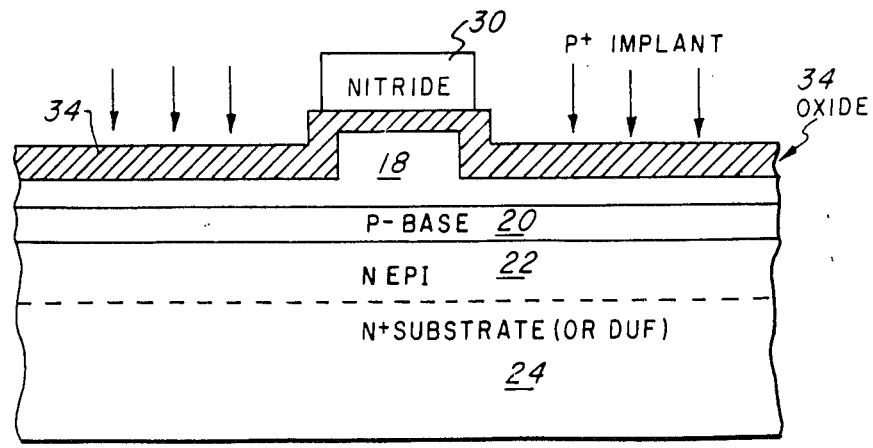

A mesa structure is then formed by etching the epitaxial silicon 18, and an oxide 34 (FIG. 3) is grown on the epi surface 18. Oxide 34 is thicker than the buffer oxide 31 under the nitride 30. This mesa structure could also be formed by a simple oxidation if only a small mesa height is desired. Then the extrinsic base is implanted through the oxide 34 as shown in FIG. 3. The oxide sidewalls 34' of oxide 34 grown on the mesa will serve to further separate the P+ and N+ regions 12' and 14'.

Figure 4:
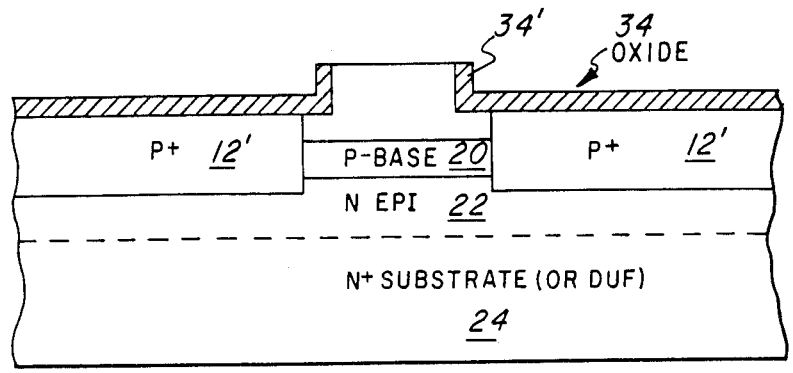

Next, the P+ implant is annealed to form extrinsic base region 12, and the niride 30 is selectively etched away (e.g. in hot phosphoric acid). After a short oxide etch, the future location of emitter region 14' is exposed as shown in FIG. 4.

Figure 5:
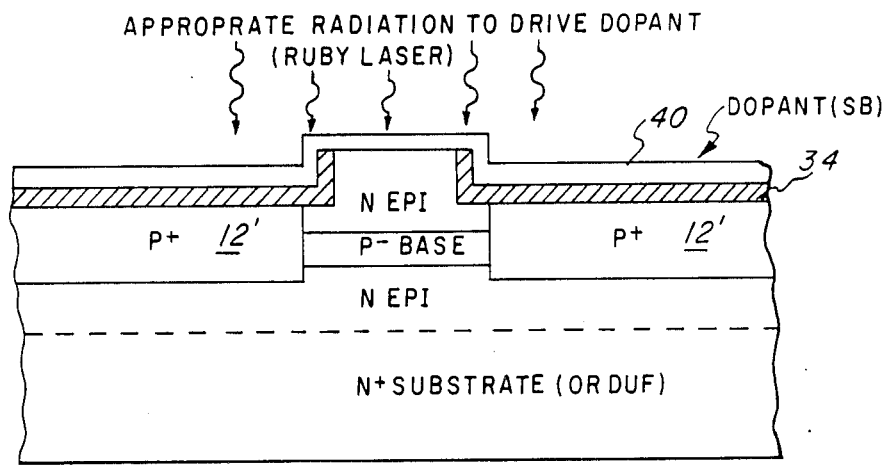

A dopant source 40, such as Sb or As, is then deposited (or spun on) and driven by radiation of an appropriate duration and wavelength (such as a pulsed Ruby laser) as shown in FIG. 5. (E.g. 0.3 J/cm$^2$ at 1.06 micron in much less than a microsecond.) The dopant will diffuse into the emitter region 18 to form a highly doped emitter and emitter contact region 14', but be masked from other regions by oxide. For surface heating of short duration, the base doping profiles will not be affected. After laser drive, the undiffused Sb can be etched away in 1:1:1/HNO3:HCl:H2O. Note that not only is the N+ self-aligned to the P+ region, but the N+ contact is self-aligned to the N+ region.

Figure 6:
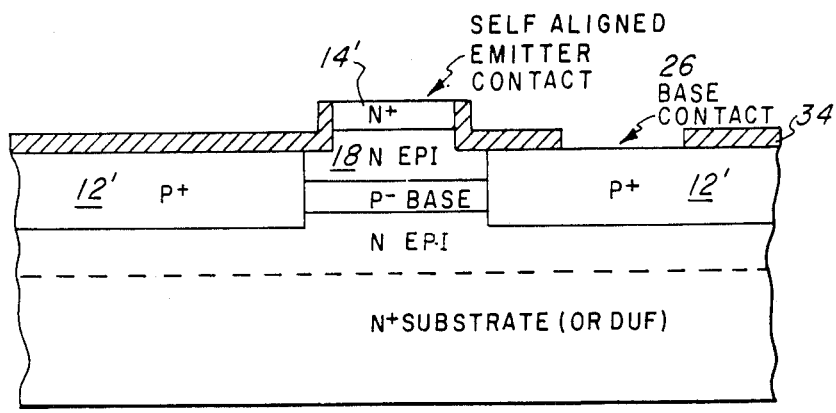

After patterning and etching base contacts, fabrication of the active devices is complete, and the device is ready for metallization to form an electrically functional integrated circuit, as shown in FIG. 6.

Adequate separation of the N+ and P+ is assured by the mesa structure and oxide sidewall. The self-aligned features allow the fabrication of structures which are limited only by pattern resolution and not pattern overlay accuracy.

This is simply one of several self-aligned schemes which could be used. The key is the ability to form N+ emitters after base junction formation.

Figure 7:
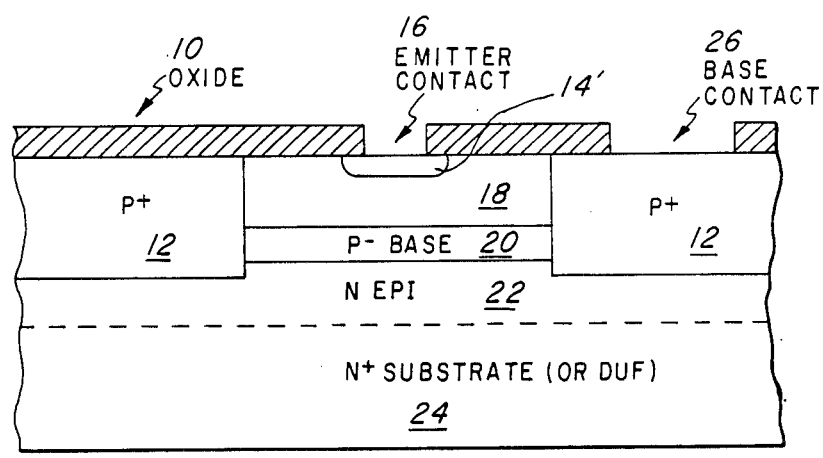
FIG. 7 shows a further embodiment of the invention.

A further embodiment of the present invention is shown in FIG. 7, where the present invention has been applied to a prior art structure like that shown in FIG. 1. In FIG. 7, the prior art emitter 14 has been replaced by a smaller emitter 14', which moreover is self-aligned to the emitter contact hole. In fabrication of this embodiment, two oxide etches are used to cut contacts: a first oxide etch cuts the emitter contact hole 16, and, after the self-aligned emitter 14' has been formed in the hole, another oxide etch is used to cut the base contact hole 26.

The present invention also works particularly well in combination with base-on-oxide structures. That is, in many bipolar processes the extrinsic base region 12 is fabricated on top on an insulating layer, which reduces capacitance and leakage.

As will be recognized by those skilled in the art, the present invention can be practiced in a tremendous range of modifications and variations, and is not limited except as set forth in the accompanying claims.

What is claimed is:

1. A process for fabricating integrated circuits comprising bipolar transistors, comprising the steps of:
    (a) providing a substrate having, at at least predetermined device locations, first conductivity type collector/emitter regions, second conductivity type base regions above said collector/emitter regions, said first conductivity type surface regions above said base regions, all formed in crystalline semiconductor material having a vertically continuous lattice structure through said collector/emitter, intrinsic base, and surface regions;
    (b) partially covering said surface regions with a patterned protective layer, said patterned protective layer exposing portions of said surface layer;
    (c) depositing a first-conductivity-type dopant source on said patterned protective layer and the exposed portions of said surface region, and
    (d) applying transient pulsed radiant heating to said dopant source on the exposed portions of said surface region to form heavily-doped first-conductivity-type emitter/collector regions within portions of said surface region.

2. The method of claim 1, further comprising the step of:
    forming an extrinsic base region in contact with said intrinsic base region, prior to said dopant deposition step.

3. The method of claim 1, wherein said substrate is composed substantially of silicon.

4. The method of claim 3, wherein said dopant source is metallic antimony.

5. A process for fabricating integrated circuits comprising bipolar transistors, comprising the steps of:
    (a) providing a substrate having, at at least predetermined device locations, first conductivity type collector/emitter regions, second conductivity type base regions above said collector/emitter regions, and first conductivity type surface regions above said base regions, all formed in crystalline semiconductor material having a vertically continuous lattice structure through said collector/emitter, intrinsic base, and surface regions;
    (b) partially covering said surface regions with a patterned protective layer, said patterned protective layer covering predetermined locations of said surface layer where transistors are to be formed;
    (c) etching, oxidizing, and ion implanting with a second-conductivity-type dopant portions of said surface region exposed by said protective layer to form extrinsic base regions covered by oxide in locations not covered by said protective layer;
    (d) removing said patterned protective layer and clearing the surface of said surface layer formerly covered by said protective layer;

(e) depositing a first-conductivity-type dopant source on said extrinsic base oxide regions and said exposed portions of said surface layer, and (f) applying transient pulsed radiant heating to said dopant source on the exposed portions of said surface region to form heavily-doped first-conductivity-type emitter/collector regions within portions of said surface layer.

6. The method of claim 5, further comprising the step of:

forming an extrinsic base region in contact with said intrinsic base region, prior to said dopant deposition step.

7. The method of claim 5, wherein said substrate is composed substantially of silicon.

8. The method of claim 7, wherein said dopant source is metallic antimony.

* * * * *